US009239154B2

(12) United States Patent
Zeng

(10) Patent No.: US 9,239,154 B2
(45) Date of Patent: Jan. 19, 2016

(54) COMBINED BACK PLATE AND ASSEMBLY METHOD THEREOF AND BACKLIGHT MODULE USING THE SAME

(71) Applicant: Shenzhen China Star Optoelectronics Technology Co., Ltd, Shenzhen, Guangdong (CN)

(72) Inventor: Dawei Zeng, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/240,327

(22) PCT Filed: Jan. 24, 2014

(86) PCT No.: PCT/CN2014/071379
§ 371 (c)(1),
(2) Date: Feb. 21, 2014

(87) PCT Pub. No.: WO2014/201870
PCT Pub. Date: Dec. 24, 2014

(65) Prior Publication Data
US 2015/0153029 A1    Jun. 4, 2015

(30) Foreign Application Priority Data

Jun. 21, 2013  (CN) .......................... 2013 1 0250085

(51) Int. Cl.
*F21V 21/00*   (2006.01)
*H05K 5/02*    (2006.01)

(52) U.S. Cl.
CPC .............. *F21V 21/00* (2013.01); *H05K 5/0217* (2013.01); *Y10T 29/49892* (2015.01)

(58) Field of Classification Search
CPC ..... G02B 6/0086; F21V 21/00; H05K 5/0217
See application file for complete search history.

(56) References Cited

FOREIGN PATENT DOCUMENTS

| CN | 2269960 Y | 12/1997 |
|---|---|---|
| CN | 201652046 U | 11/2010 |
| CN | 102159044 A | 8/2011 |
| CN | 102595832 A | 7/2012 |
| CN | 202389104 U | 8/2012 |
| CN | 103335283 A | 10/2013 |
| DE | 100 63 860 A1 | 7/2002 |

OTHER PUBLICATIONS

Chinese Search Report mailed Aug. 8, 2014, issued to the corresponding Chinese Application No. 201310250085.4.
International Search Report dated May 9, 2014, issued to the corresponding International Application No. PCT/CN2014/071379.

*Primary Examiner* — Mary Ellen Bowman
(74) *Attorney, Agent, or Firm* — Stein IP, LLC

(57) ABSTRACT

The present disclosure relates to a combined back plate, a method for assembling the combined back plate, and a backlight module comprising the combined back plate. The combined back plate includes a frame formed by a plurality of frame strips provided with slots and a plurality of plugboards provided with bending walls that can be engaged with the slots. Through combining the bending walls and the slots, the plurality of plugboards can be mounted together so as to form the combined back plate. With the combined back plate of the present disclosure being formed by splicing a plurality of plugboards, back plates with different sizes can be manufactured in a convenient manner.

9 Claims, 6 Drawing Sheets

COMBINED BACK PLATE AND ASSEMBLY METHOD THEREOF AND BACKLIGHT MODULE USING THE SAME

FIELD OF THE INVENTION

The present disclosure relates to a liquid crystal display component, and more particularly, relates to a back plate for a liquid crystal display panel. The present disclosure also relates to an assembly method of the combined back plate and a backlight module using the combined back plate.

BACKGROUND OF THE INVENTION

Liquid crystal display devices are widely used due to the advantages of thin body, power saving and the like. At present, most of liquid crystal display devices on the market are backlight liquid crystal displays, with each including a liquid crystal display panel and a backlight module. The working principle of the liquid crystal display panel is to dispose liquid crystal molecules between two parallel glass sheets, and control the directions of the liquid crystal molecules to refract rays from the backlight module to generate pictures. Because the liquid crystal display panel does not emit light itself, a light source needs to be provided by means of the backlight module to display images in a normal manner. Accordingly, the backlight module becomes one of important components of the liquid crystal display device.

The backlight module generally includes a back plate, a light guide plate, a backlight and an optical diaphragm. In the prior art, the back plate generally adopts an integral structure, and this structure is relatively large in size, so that a production mould for the back plate is huge and is difficult to maintain, and the requirement for the punch forming technology is relatively high.

In the prior art, the back plate with a structure shown in FIG. 11 exists, including a body 22 and a first support 24 connected to the body 22. The body 22 includes a substrate 222, and the first support 24 includes a first baseplate 242 and a first side plate 244 vertically connected to the first baseplate 242. One end of the first baseplate 242 away from the first side plate 244 is provided with a first bending portion 246 and a first extending portion 248 connected to the first bending portion 246 and arranged horizontally. The first extending portion 248 is overlapped on one end of the substrate 222, and fixedly connected with the substrate 222 through rivets or screws. That is, the combined back plate is formed by splicing the body 22 and the support 24. Although the back plate is divided into two parts, it still has an integral structure. When the area of the back plate is relatively large, inconvenience is brought to assembly. Therefore, a back plate convenient to produce and assemble is in urgent need.

SUMMARY OF THE INVENTION

Aiming at the above-mentioned problems, the present disclosure proposes a combined back plate, which is formed by splicing a plurality of plugboards together and can be conveniently produced with required sizes. The present disclosure also proposes an assembly method of the combined back plate and a backlight module using the combined back plate.

According to the first aspect of the present disclosure, a combined back plate is provided, including a frame formed by a plurality of frame strips provided with slots and a plurality of plugboards provided with bending walls, wherein the bending walls are engaged with the slots in a shape matching form, so that the plurality of plugboards can be mounted in the frame to form the combined back plate.

The combined back plate according to the present disclosure adopts plug-in assembly, so that the assembly operation is simplified. Back plates with different sizes can be manufactured by mounting different number of plugboards, so that separate moulds are no longer necessary for manufacturing large-sized back plates, thus reducing production difficulty and production cost of the large-sized back plates.

In an embodiment, the cross section of each frame strip is L-shaped, and a slot is formed in the frame strip in a penetrating manner along the length direction. In an embodiment, the plugboards include at least two first plugboards and at least one second plugboard located between the two first plugboards, wherein each first plugboard includes a rectangular board body and three bending walls formed at three edges thereof respectively, and each second plugboard includes a rectangular board body and two bending walls formed at two opposite edges thereof respectively. In a preferred embodiment, the bending walls are L-shaped, and the slots are also L-shaped. The size of the transverse extending portion of each L-shaped frame strip is smaller than or equal to that of the transverse extending portion of each L-shaped bending wall. Through these structures, the plugboards can be mounted by pushing the L-shaped bending walls of the plugboards into the L-shaped slots of the frame strips, and thus the back plate can be conveniently assembled.

In an embodiment, each plugboard includes a rectangular board body and four bending walls formed at four edges of the board body respectively. In this way, the same plugboards can be manufactured, and multiple moulds are not needed, so that the production cost is reduced. In addition, in an assembly status, the bending walls of the adjacent plugboards abut against each other, thus improving the assembly strength of the plugboards. In a preferred embodiment, the sizes of the transverse extending portions of the L-shaped bending walls are equal. In this way, the same frame strips can be manufactured, and similarly, multiple moulds are not needed and the production cost is reduced.

In an embodiment, the vertical extending portion of each L-shaped bending wall of each plugboard is provided with a plurality of first fixing holes, and second fixing holes corresponding to the first fixing holes are formed in each L-shaped frame strip. In a mounting status, the first fixing holes can be fixedly connected together with the second fixing holes by means of fixing members, so as to firmly connect the plugboards with the frame strips. Particularly, the adjacent plugboards can be fixedly connected together through the first fixing holes, so as to improve the assembly strength. In a preferred embodiment, the adjacent frame strips are connected through an angular connector.

In an embodiment, the frame strips are made of aluminum. Aluminum has a relatively low density, and thus the weight of the whole combined back plate can be reduced.

According to the second aspect of the present disclosure, a method for assembling the above-mentioned combined back plate is provided, including the following steps: (a) providing two frame strips arranged in parallel; (b) placing a first plugboard between the two frame strips, and pushing the plugboard to the ends of the two frame strips; (c) assembling a third frame strip on the first plugboard in such a manner that the third frame strip is vertical to the two parallel frame strips; (d) continuously assembling a predefined number of additional plugboards on the rear side of the first plugboard; and (e) assembling a fourth frame strip on the last plugboard in such a manner that the fourth frame strip is vertical to the two parallel frame strips.

According to the third aspect of the present disclosure, a backlight module including the above-mentioned combined back plate is provided.

In the context, the term "transverse" is specified as the direction parallel to the board body of each plugboard in the assembly status, and "vertical" is specified as the direction perpendicular to the transverse.

Compared with the prior art, the present disclosure has the advantages that the back plate of the present disclosure is formed by splicing a plurality of plugboards together, and back plates with different sizes can be manufactured by mounting different number of plugboards. Therefore, separate moulds are no longer necessary for manufacturing large-sized back plates, thus reducing production difficulty and production cost of the large-sized back plates. The L-shaped slots are formed in the frame strips, and the L-shaped bending walls are formed on the plugboards, so that the plugboards can be conveniently assembled together with the frame strips, thus simplifying the assembly.

BRIEF DESCRIPTION OF THE DRAWINGS

The present disclosure will be described in more detail below based on the embodiments with reference to the accompanying drawings, in which.

In the accompanying drawings, the same components are indicated by the same reference signs. The accompanying drawings are not drawn to actual scale.

DETAILED DESCRIPTION OF THE EMBODIMENTS

The present disclosure will be further illustrated below in conjunction with the accompanying drawings.

Figure 1:
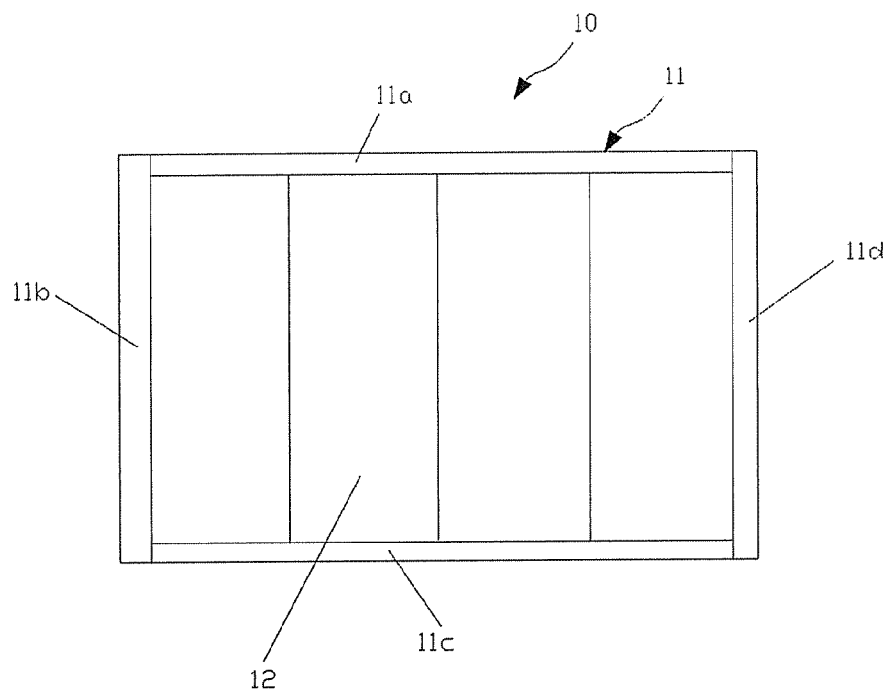
FIG. 1 is a schematic diagram of a combined back plate according to the present disclosure.

FIG. 1 schematically shows a combined back plate 10 (referred to as back plate 10 below) according to the present disclosure. The back plate 10 includes a frame 11 formed by four frame strips 11a, 11b, 11c and 11d, and a plurality of plugboards 12 mounted in the frame 11. To manufacture back plates 10 with different sizes, the frame strips can be manufactured with corresponding lengths and a corresponding number of plugboards 12 are spliced together. FIG. 1 merely shows a rectangular back plate 10; however, the back plate 10 can also be in other shape in practice. The number of the frame strips is not limited to four, and when the back plate 10 is relatively large, more frame strips can be used. In an embodiment, the frame strips are made of aluminum, so as to reduce the weight of the back plate 10.

Figure 2:
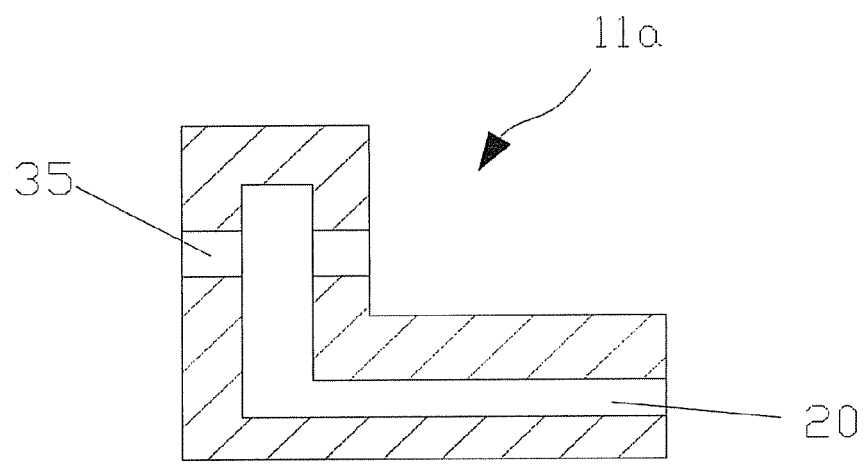
FIG. 2 is a cross section diagram of a frame strip according to the present disclosure.
Figure 3:
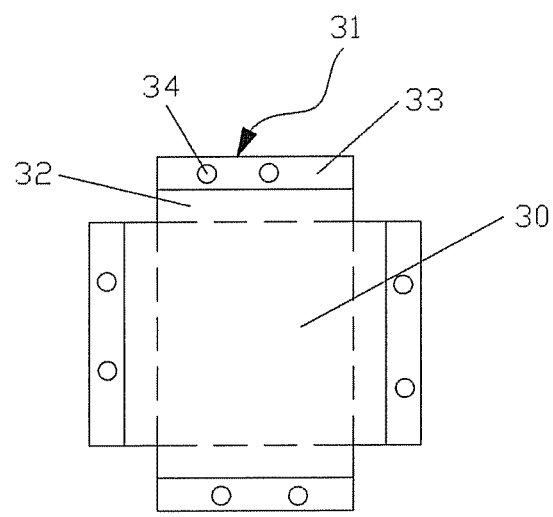
FIG. 3 is a top view of a plugboard according to the present disclosure.
Figure 4:
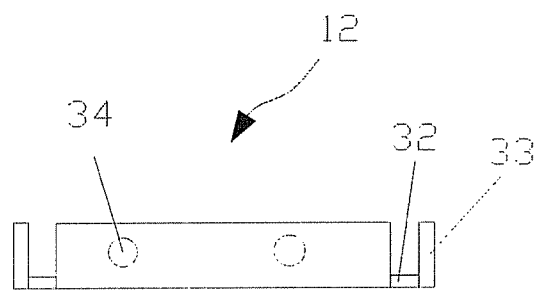
FIG. 4 is a side view of the plugboard according to the present disclosure.
Figure 5:
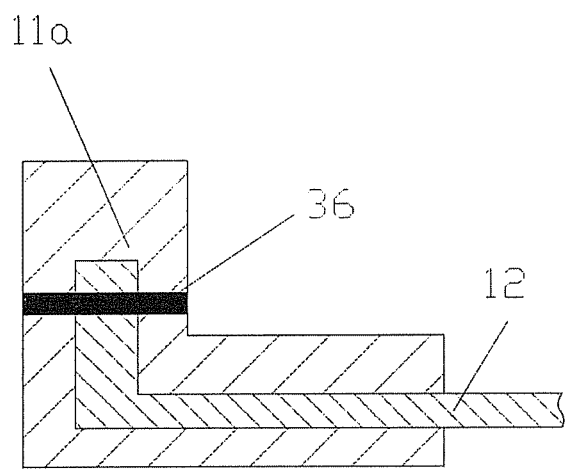
FIG. 5 is a schematic diagram showing an assembled structure of the frame strip and the plugboard according to the present disclosure.

Connection between the frame strip 11a and one plugboard 12 is described below by taking the frame strip 11a as an example. A slot is formed in the frame strip 11a, and bending walls corresponding to the slot are formed at the edges of the plugboard 12. In an embodiment, the plugboard 12 is designed to include a rectangular board body 30 and an L-shaped bending wall 31 formed at each of four edges of the board body 30, as shown in FIG. 3. Each bending wall 31 includes a transverse extending portion 32 located in the same plane as the board body 30 and a vertical extending portion 33 vertical to the board body 30. FIG. 4 shows the state after the bending walls 31 of the plugboard 12 are bent. The frame strip 11a is constructed with an L-shaped cross section, and an L-shaped slot 20 (as shown in FIG. 2) is formed in the frame strip 11a in a penetrating manner along the length direction. The size of the slot 20 is matched with the sizes of the bending walls 31, so that the bending walls 31 of the plugboard 12 can be plugged into the slot 20 (as shown in FIG. 5), and the plugboard 12 can be pushed to move along the frame strip 11a for assembly, thus greatly simplifying assembly of the back plate 10. To facilitate production, the sizes of the transverse extending portions 32 of the bending walls 31 are the same, and the sizes of the vertical extending portions 33 are also the same.

Figure 8:
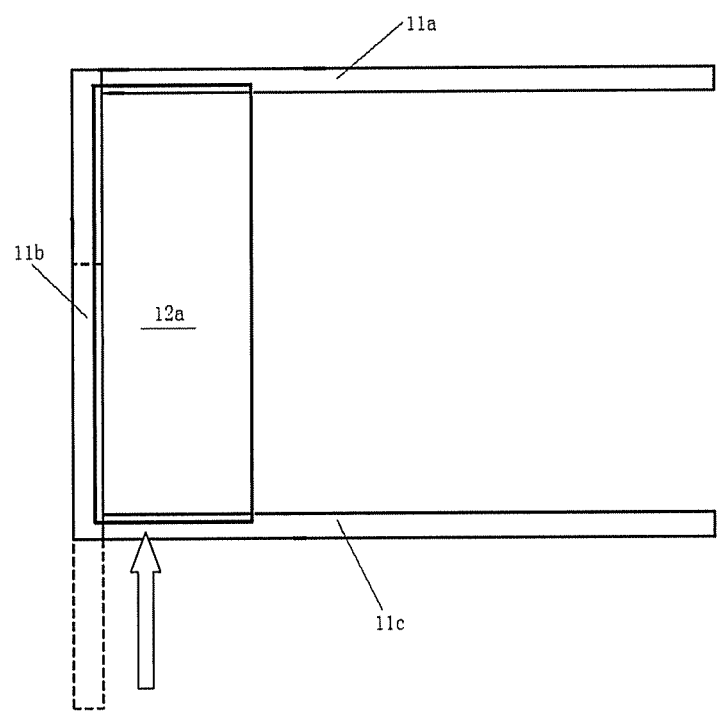
FIGS. 8 to 10 are diagrams showing the process of assembling the combined back plate according to the present disclosure.
Figure 9:
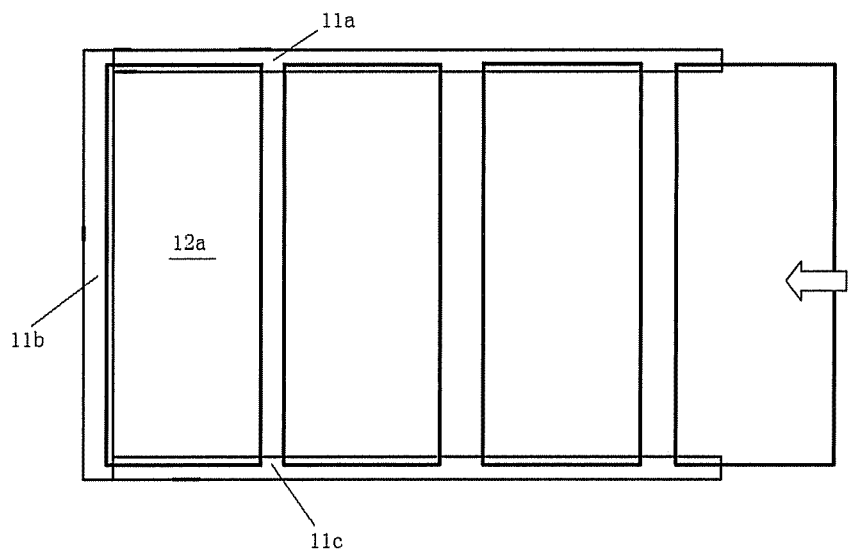
Figure 10:
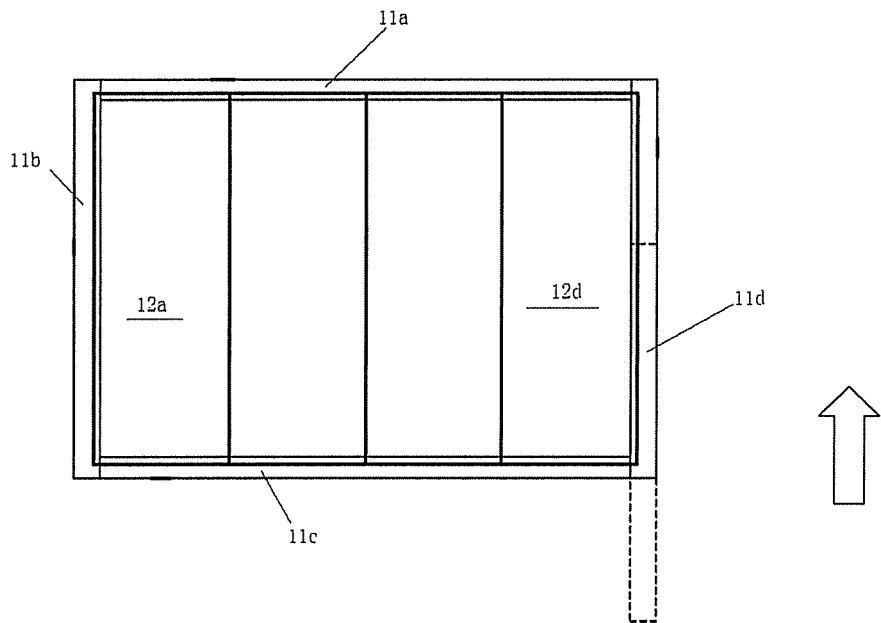
Figure 11:
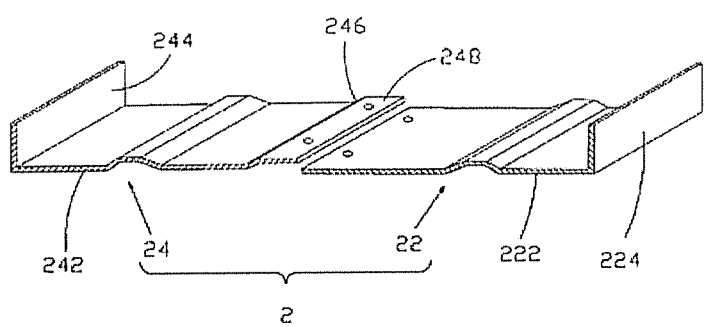
FIG. 11 is a schematic diagram of a back plate in the prior art.

Assembly steps of the back plate 10 according to the present disclosure are described below according to FIGS. 8 to 10.

Firstly, the frame strips 11a and 11c are fixedly arranged in parallel, and the distance between the frame strips 11a and 11c is matched with the size of each plugboard 12. Secondly, the bending walls 31 at two ends of the first plugboard 12a are plugged into the slots 20 of 11a and 11c respectively, and pushed to one end of each of the frame strips 11a and 11c to complete preliminary fixing. Then, the side frame strip 11b is plugged into another bending wall 31 of the plugboard 12 along the direction shown by the arrow in FIG. 8, so as to fully fix the plugboard 12. Subsequently, a predefined number of additional plugboards are plugged from the other ends of the frame strips 11a and 11c continuously, as shown by the arrow in FIG. 9. Finally, the frame strip 11d is plugged into the last plugged plugboard 12d, as shown by the arrow in FIG. 10, thus completing assembly of the back plate 10.

To enable the back plate 10 firmer, the vertical extending portion 33 of each L-shaped bending wall 31 of each plugboard 12 is provided with a plurality of first fixing holes 34, and second fixing holes 35 corresponding to the first fixing holes 34 are formed in each L-shaped frame strip. After the assembly is finished, the plugboards 12 can be fixedly connected together with the corresponding frame strips and the adjacent plugboards 12 are also fixedly connected together, both by means of fixing members 36, such as bolts. In addition, the adjacent frame strips can also be fixedly connected together by using angular connectors (not shown), so as to improve the strength of the back plate 10.

Figure 6:
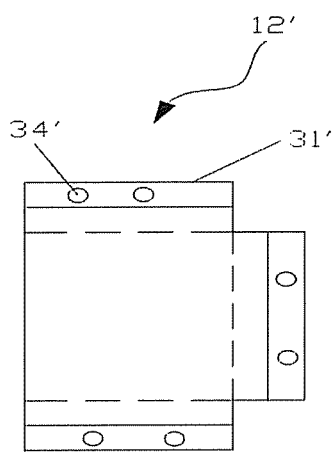
FIG. 6 is a top view of a first plugboard.
Figure 7:
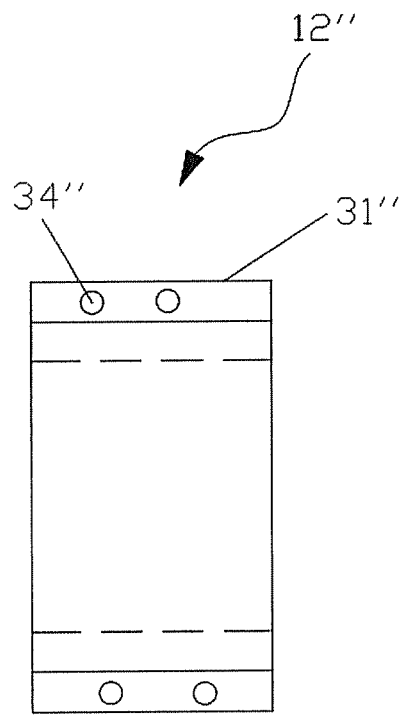
FIG. 7 is a top view of a second plugboard.

It should be understood that the plugboards can be in two types, wherein each first type of plugboard 12' includes three bending walls 31' (as shown in FIG. 6), and each second type of plugboard 12" merely includes two opposing bending walls 31" (as shown in FIG. 7). The plugboards 12' must be used with the plugboards 12" together, wherein the plugboards 12' are mounted at two ends of the back plate 10, namely adjacent to the side frame strips 11b and 11d, whereas the plugboards 12" are mounted between the two plugboards 12'. It is easily understood that fixing holes are also formed in the bending walls of the two types of plugboards 12' and 12" to fixedly connect the plugboards 12' and 12" with the frame strips, so as to improve the strength of the back plate 10.

Although it is not illustrated in the accompanying drawings, the back plate 10 of the present disclosure can also be used in a backlight module, and can improve the assembly efficiency of the backlight module.

Although the present disclosure has been described with reference to the preferred embodiments, various modifications could be made to the present disclosure without departing from the scope of the present disclosure and components in the present disclosure could be substituted by equivalents. Particularly, as long as structural conflicts do not exist, all technical features mentioned in all the embodiments may be combined together in any mode. The present disclosure is not limited to the specific embodiments disclosed in the description, but includes all technical solutions falling into the scope of the claims.

The invention claimed is:

1. A combined back plate, comprising: a frame formed by a plurality of frame strips each provided with slots, and a plurality of plugboards each provided with bending walls, wherein each bending wall is engaged with a corresponding one of the slots in a shape matching manner, so that the plurality of plugboards are mountable in the frame to form the combined back plate;
wherein:
   each frame strip has an L-shaped cross section, each bending wall is L-shaped,
   a size of a transverse extending portion of each L-shaped frame strip is smaller than that of a transverse extending portion of a corresponding one of the L-shaped bending walls, and
   a vertical extending portion of each L-shaped bending wall of the corresponding plugboard is provided with a plurality of first fixing holes, and second fixing holes corresponding to the first fixing holes are formed in the corresponding L-shaped frame strip.

2. The combined back plate according to claim 1, wherein each plugboard includes at least two first plugboards and at least one second plugboard located between said the at least two first plugboards; and
   wherein each first plugboard includes a rectangular board body and three bending walls formed at three edges thereof respectively, and each second plugboard includes a rectangular board body and two bending walls formed at two opposite edges thereof respectively.

3. The combined back plate according to claim 2, wherein each bending wall and the corresponding slot are L-shaped.

4. The combined back plate according to claim 3, wherein the cross section of each frame strip is L-shaped, and the slots are formed in the frame strip in a penetrating manner along the length direction thereof.

5. The combined back plate according to claim 4, wherein the size of the transverse extending portion of each L-shaped frame strip is smaller than or equal to that of the transverse extending portion of the corresponding L-shaped bending wall.

6. The combined back plate according to claim 1, wherein in the assembled state, adjacent ones of the frame strips are connected with each other through an angular connector.

7. The combined back plate according to claim 1, wherein each plugboard includes a rectangular board body and four of the bending walls formed at four edges of the board body respectively.

8. A backlight module, comprising the combined back plate according to claim 1.

9. A method for assembling the combined back plate according to claim 2, comprising the following:
   (a) providing first and second frame strips arranged in parallel;
   (b) placing a first plugboard between the first and second frame strips, and pushing the first plugboard to the ends of the two frame strips;
   (c) assembling a third frame strip on the first plugboard in such a manner that the third frame strip is vertical to the first and second parallel frame strips;
   (d) continuously assembling a predefined number of additional plugboards following the first plugboard; and
   (e) assembling a fourth frame strip on the last plugboard in such a manner that the fourth frame strip is vertical to the first and second parallel frame strips.

* * * * *